(12) United States Patent
Shen (10) Patent No.: US 7,192,815 B2
(45) Date of Patent: Mar. 20, 2007

(54) METHOD OF MANUFACTURING A THIN FILM TRANSISTOR

(75) Inventor: Chia-Nan Shen, Taipei County (TW)

(73) Assignee: Chunghwa Picture Tubes, Ltd., Taipei (TW)

(*) Notice: Subject to any disclaimer, the term of this patent is extended or adjusted under 35 U.S.C. 154(b) by 95 days.

(21) Appl. No.: 10/904,513

(22) Filed: Nov. 15, 2004

(65) Prior Publication Data

US 2006/0105506 A1 May 18, 2006

(51) Int. Cl.
*H01L 21/84* (2006.01)
(52) U.S. Cl. .................. 438/164; 438/517; 257/72; 257/E21.413
(58) Field of Classification Search .......... 438/164, 438/517; 257/72, E21.412, E21.413
See application file for complete search history.

(56) References Cited

U.S. PATENT DOCUMENTS

| 5,292,675 | A | * | 3/1994 | Codama ............... 438/163 |
| 5,627,084 | A | * | 5/1997 | Yamazaki et al. ........ 438/166 |
| 6,887,745 | B2 | * | 5/2005 | Chen et al. ............... 438/154 |
| 2002/0142525 | A1 | * | 10/2002 | Ohnuma .................... 438/151 |
| 2003/0042559 | A1 | * | 3/2003 | Takemura et al. ......... 257/408 |

* cited by examiner

*Primary Examiner*—Bradley K. Smith
*Assistant Examiner*—Steven J. Fulk
(74) *Attorney, Agent, or Firm*—Jiang Chyun IP Office (57) ABSTRACT

A method of manufacturing a thin film transistor is described. A polysilicon island is formed over a substrate. A gate insulating layer is formed over the substrate to cover the polysilicin island. A gate is formed on the gate insulating layer above the polysilicon island. A passivation layer is formed over the substrate to cover the gate and the gate insulating layer. An ion implanting process is carried out to form a source/drain in the polysilicon island beside the gate, wherein a region between the source and the drain is a channel. After the first passivation layer is removed, a patterned dielectric layer is formed over the substrate, wherein the dielectric layer exposes a portion of the source/drain. A source/drain conductive layer is formed over the dielectric layer and is electrically connected to the source/drain.

19 Claims, 12 Drawing Sheets

METHOD OF MANUFACTURING A THIN FILM TRANSISTOR

BACKGROUND OF THE INVENTION

1. Field of the Invention

The present invention generally relates to a method of manufacturing a thin film transistor. More particularly, the present invention relates to a method of manufacturing a low temperature polysilicon thin film transistor (LTPS-TFT).

2. Description of Related Art

The traditional fabrication method of polysilicon thin film transistors includes a solid phase crystallization (SPC) process. Due to its high process temperature which is more than 1000° C., the SPC process uses a quartz substrate with high melting point. The quartz substrate is more expensive than the glass substrate. In addition, the panel size is merely about 2 to 3 inches because of the restriction of the substrate size. With the advance of laser technology, an excimer laser annealing process has been applied to LTPS-TFT processes.

The excimer laser annealing process applies a laser beam on the amorphous silicon layer, melting the structure thereof and then recrystallizing such amorphous silicon layer into a polysilicon layer. More important, the process can be finished under 600° C. The cheap glass substrate can also be applied to the fabrication of the polysilicon thin film transistor so as to create big size panel. The polysilicon thin film transistor generated from the process is also called a low temperature polysilicon thin film transistor.

In the LTPS-TFT processes, ion implantation processes are important. However, the gate insulating layer above the channel is usually damaged during the channel doping step so that the device characteristic, such as threshold voltage, is influenced. If the channel doping step is not carried out, the threshold voltage of NMOS transistor is not easily controlled. In addition, during source/drain ion implantation photoresist layers may be carbonized by the high-energy ion implantation so that the photoresist layers are not easily removed subsequently.

SUMMARY OF THE INVENTION

Accordingly, the present invention is directed to a method of manufacturing a thin film transistor capable of protecting the gate insulating layer from damage during the ion implanting processes.

The present invention is directed to a method of manufacturing a thin film transistor capable of easily removing the photoresist layers after the ion implanting processes.

According to an embodiment of the present invention, a method of manufacturing a thin film transistor is provided. A polysilicon island is formed over a substrate. A gate insulating layer is formed over the substrate to cover the polysilicon island. A gate is formed on the gate insulating layer above the polysilicon island. A first passivation layer is formed over the substrate to cover the gate and the gate insulating layer. A first ion implanting process is performed to form a source/drain in the polysilicon island beside the gate, wherein a region between the source and the drain is a channel. After removing the first passivation layer, a patterned dielectric layer is formed over the substrate exposing a portion of the source/drain. Next, a source/drain conductive layer is formed over the dielectric layer, wherein the source/drain conductive layer is electrically connected to the source/drain.

According to an embodiment of the present invention, said first passivation layer is a silicon nitride layer.

According to an embodiment of the present invention, said first passivation layer has a thickness in a range of 50~1000 angstrom.

According to an embodiment of the present invention, after the step of removing the first passivation layer and before the step of forming the patterned dielectric layer, the method further comprises performing a lightly ion implanting process to form a lightly doped drain (LDD) between the channel and the source/drain by using the gate as mask.

According to an embodiment of the present invention, after the step of forming the gate insulating layer and before the step of forming the gate, the method further comprises forming a second passivation layer over the gate insulating layer. A second ion implanting process is performed to dope ions into the polysilicon island. Thereafter, the second passivation layer is removed.

According to an embodiment of the present invention, said second passivation layer is a silicon nitride layer.

According to an embodiment of the present invention, said second passivation layer has a thickness in a range of 50~1000 angstrom.

According to an embodiment of the present invention, after the step of forming the gate and before the step of forming the first passivation layer over the substrate, the method further comprises partially etching the gate insulating layer by using the gate as mask so that the gate insulating layer under the gate has a thickness larger than that of the gate insulating layer at other positions.

According to an embodiment of the present invention, after the step of forming the gate and before the step of forming the first passivation layer over the substrate, the method further comprises etching the gate insulating layer by using the gate as mask so as to remove the gate insulating layer not covered by the gate.

According to an embodiment of the present invention, before the step of forming the polysilicon island over the substrate, the method further comprises forming a buffer layer over the substrate.

According to another embodiment of the present invention, a method of manufacturing a thin film transistor is provided. A first polysilicon island and a second polysilicon islands are formed over a substrate. A gate insulating layer is formed over the substrate to cover the first and second polysilicon islands. A first passivation layer is formed over the gate insulating layer. Thereafter, a first ion implanting process is performed to dope ions into the first polysilicon island. After removing the first passivation layer, a first gate is formed on the gate insulating layer above the first polysilicon island while a second gate is formed on the gate insulating layer above the second polysilicon island. A second passivation layer is formed over the substrate to cover the first and second gates. A second ion implanting process is performed to form a second source/drain in the second polysilicon island beside the second gate, wherein a region between the second source and the second drain is a second channel. A third ion implanting process is performed to form a first source/drain in the first polysilicon island beside the first gate, wherein a region between the first source and the first drain is a first channel. At least of the second passivation layer above the first polysilicon island is removed. Next, a lightly ion implanting process is performed to form a lightly doped drain (LDD) between the first channel and the first source/drain.

According to an embodiment of the present invention, said first passivation layer is a silicon nitride layer and has a thickness in a range of 50~1000 angstrom.

According to an embodiment of the present invention, said second passivation layer is a silicon nitride layer and has a thickness in a range of 50~1000 angstrom.

According to an embodiment of the present invention, after the step of removing the second passivation layer, the method further comprises forming a patterned dielectric layer over the substrate, wherein the patterned dielectric layer exposes a portion of the first source/drain and a portion of the second source/drain. Thereafter, a first source/drain conductive layer and a second source/drain conductive layer are formed over the patterned dielectric layer, wherein the first source/drain conductive layer is electrically connected to the first source/drain while the second source/drain conductive layer is electrically connected to the second source/drain.

According to an embodiment of the present invention, after the step of forming the first and second gate, the method further comprises partially etching the gate insulating layer by using the first and second gates as mask so that the gate insulating layer underneath the first and second gates has a thickness larger than that of the gate insulating layer at other positions.

According to an embodiment of the present invention, after the step of forming the first and second gates, the method further comprises etching the gate insulating layer by using the first and second gates as mask so as to remove the gate insulating layer not covered by the first and second gates.

According to an embodiment of the present invention, the whole second passivation layer is removed at the step of removing at least of the second passivation layer above the first polysilicon island.

According to an embodiment of the present invention, after the step of doping ions into the first polysilicon island and before the step of removing the first passivation layer, the method further comprises performing a fourth ion implanting process to dope ions in the second polysilicon island.

In the present invention, the passivation layer is formed over the substrate before the ion implanting processes are performed so that the film underneath the passivation layer is protected. In addition, photoresist layers if used as implanting mask can be removed easily and not remained because the photoresist layers are formed on the passivation layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
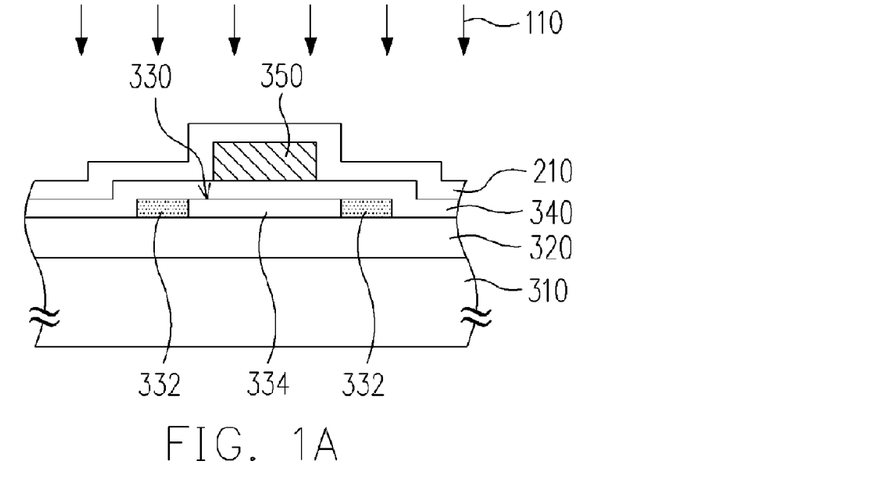
FIG. 1A to FIG. 1C are schematic cross-sectional views showing a method of manufacturing a thin film transistor according a first embodiment of the present invention.
Figure 1B:
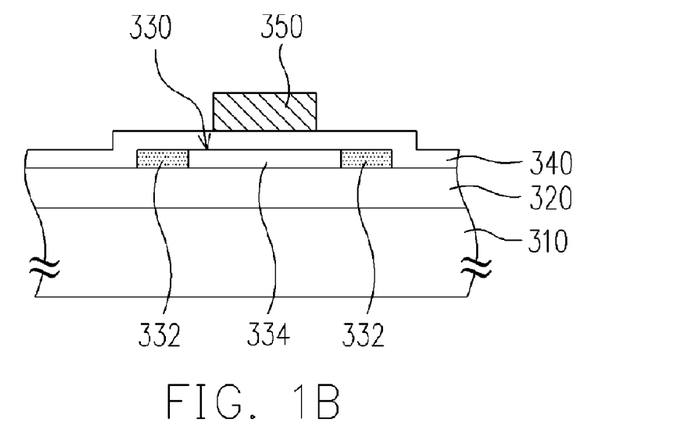
Figure 1C:
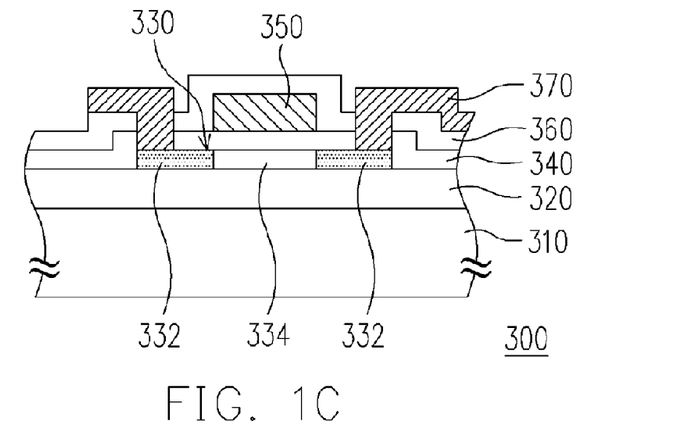

FIG. 1A to FIG. 1C are schematic cross-sectional views showing a method of manufacturing a thin film transistor according a first embodiment of the present invention. As shown in FIG. 1A, a polysilicon island 330 is formed over a substrate 310. The substrate 310 is a glass substrate, a quartz substrate or a plastic substrate, for example.

In an embodiment, the polysilicon island 330 is formed by the following steps. An amorphous silicon layer (not shown) is formed over the substrate 310, wherein the amorphous silicon layer is formed with a chemical vapor deposition (CVD) process or a plasma enhanced CVD process, for example. Next, the amorphous silicon layer is annealed with a laser annealing process so that the amorphous silicon layer is transformed into a polysilicon layer. The polysilicon layer is patterned by photolithography process and etching process to form the polysilicon island 330.

The laser annealing process above mentioned may be an excimer laser process, a solid-state laser process or a diode pumped solid-state laser (DPSS) process. In particular, before the laser annealing for the amorphous silicon layer is performed, a dehydrogenation step may further be carried out so as to reduce the hydrogen content of the amorphous silicon layer.

As shown in FIG. 1A, a gate insulating layer 340 is formed over the substrate 310 to cover the polysilicon island 330. For example, the gate insulating layer 340 is constituted of silicon oxide or other suitable insulating material. For example, the gate insulating layer 340 is formed by PECVD with reactive gases of $SiH_4/N_2O$ or $TEOS/O_2$ to form a silicon oxide layer.

A gate 350 is formed on the gate insulating layer 340 above the polysilicon island 330. In an embodiment, the gate 350 is formed by the steps of forming a gate material layer (not shown), such as a chromium layer or other suitable metal layer, by sputtering process or other suitable deposition process; and patterning the gate material layer to form the gate 350 with a photolithography process and an etching process.

After forming the gate 350, a passivation layer 210 is formed over the substrate 310 to cover the gate 350 and the gate insulating layer 340. The passivation layer 210 has a thickness in a range of 50~1000 angstrom, and 200 angstrom is preferable. The passivation layer 210 is a silicon nitride layer, for example. The passivation layer 210 is formed by PECVD with reactive gases of $SiH_4/NH_3$ to form a silicon nitride layer, for example. Thereafter, an ion implanting process 110 is carried out to form a source/drain 332 in the polysilicon island 330 beside the gate 350, wherein a region between the source and the drain is a channel 334.

As shown in FIG. 1B, after forming the source/drain 332, the passivation layer 210 is removed. If the passivation layer 210 is a silicon nitride layer, phosphoric acid, for example, may be used to remove the passivation layer 210.

As shown in FIG. 1C, after the passivation layer 210 is removed, a patterned dielectric layer 360 is formed over the substrate 310, wherein the patterned dielectric layer 360 exposes a portion of the source/drain 332. In detail, a dielectric layer (not shown) is formed over the substrate 110 by PECVD, wherein the dielectric layer is constituted of silicon oxide, silicon nitride or other suitable insulating material. A photolithography process and an etching process are performed to pattern the dielectric layer so as to the patterned dielectric layer 360.

A source/drain conductive layer 370 is formed over the patterned dielectric layer 360 and electrically connected to the source/drain 332. In an embodiment, a source/drain conductive material (not shown) is formed over the patterned dielectric layer 360 by sputtering process or other suitable deposition process, wherein the source/drain conductive material is constituted of chromium or other suitable metal. A photolithography process and an etching process are performed to pattern the source/drain conductive material to form the source/drain conductive layer 370. It should be noted that the deposition processes of the dielectric layer 360 and the source/drain conductive layer 370 are conducted at high temperature so that ions of the source/drain 332 may diffuse toward the channel 334. Hence, at least of the edges of the source/drain 332 is aligned to the edge of the gate 350. Also, an additional thermal process may further be performed after forming the thin film transistor 300 so that ions of the source/drain 332 diffuse toward the channel 334. The thermal process is, for example, a rapid thermal annealing (RTA) process, a furnace annealing (FA) process or other known annealing process.

In an embodiment, a buffer layer 320 is further formed over the substrate 310 before forming the polysilicon island 330 so as to prevent metal ions in the substrate 310 from diffusing into the polysilicon island 330. The buffer layer 320 is formed by low pressure CVD (LPCVD) or PECVD. In particular, the buffer layer 320 may be a single layer composed of silicon oxide or a double layer composed of silicon oxide/silicon nitride. The buffer layer 320 having a suitable thickness can isolate polysilicon island 330 from metal ions in the substrate 310 diffusing into. The buffer layer 320 may also reduce the cooling rate of the laser annealing so as to form a polysilicon layer having larger grains.

Figure 2A:
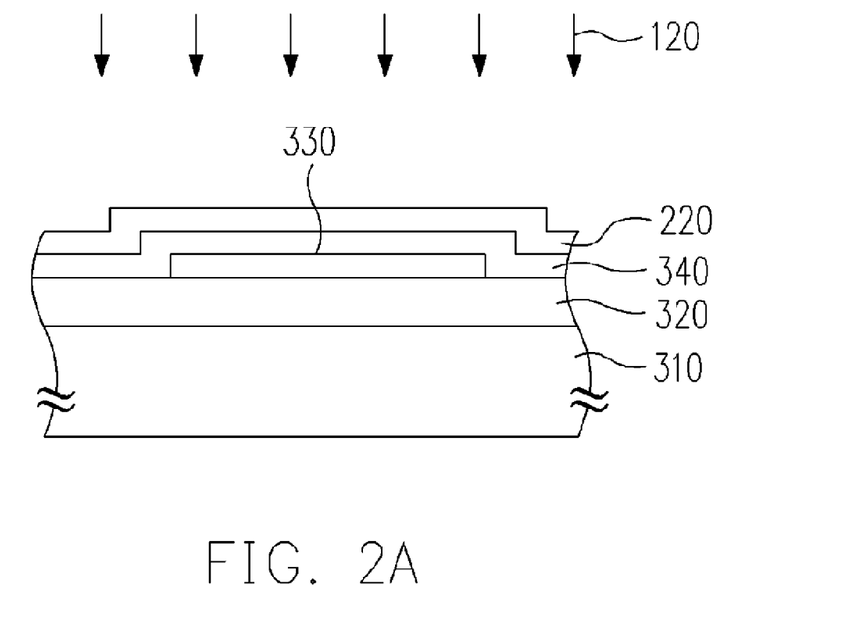
FIG. 2A to FIG. 2D are schematic cross-sectional views showing a method of manufacturing a thin film transistor according a second embodiment of the present invention.

FIG. 2A to FIG. 2D are schematic cross-sectional views showing a method of manufacturing a thin film transistor according a second embodiment of the present invention. As shown in FIG. 2A, the second embodiment is similar to the first embodiment while the difference therebetween is that after forming the polysilicon island 330 and the gate insulating layer 340, a passivation layer 220 is further formed over the gate insulating layer 340, wherein the passivation layer 220 has a thickness in a range of 50~1000 angstrom, and 200 angstrom is preferable. The passivation layer 220 is a silicon nitride layer, for example. Thereafter, an ion implanting process 120 is carried out to dope ions into the polysilicon island 330. The ion implanting process 120 is also called channel doping for adjusting the electrical property of the polysilicon island 330. Next, a gate 350 is formed on the gate insulating layer 340 above the polysilicon island 330. In the case, the passivation layer 220 is formed over the gate insulating layer 340 before performing the ion implanting process 120 so that the gate insulating layer 340 is protected from damage of the ion implanting process 120.

Figure 2B:
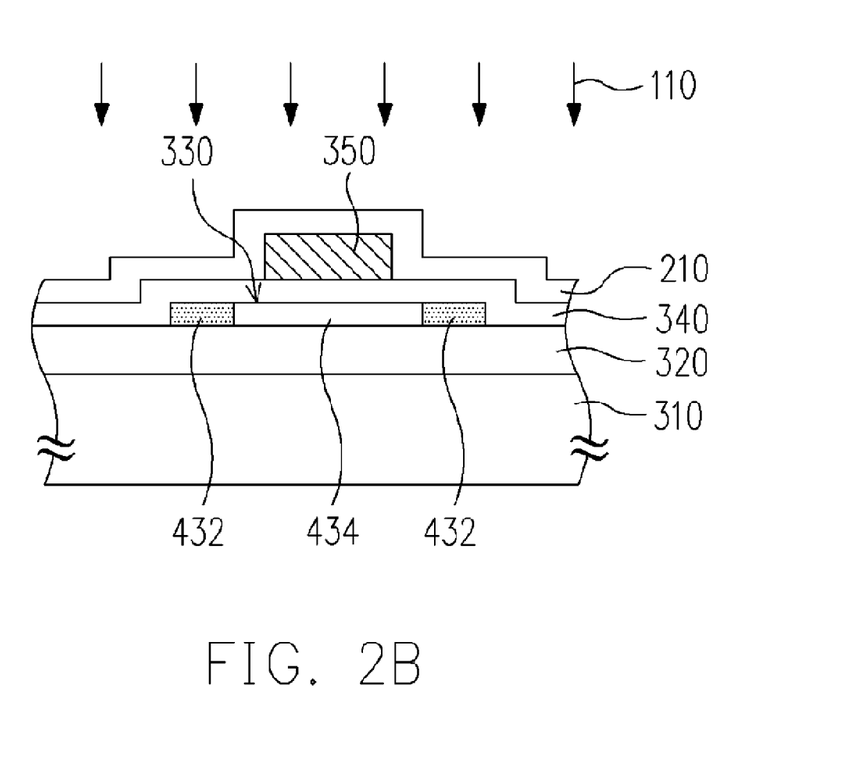

As shown in FIG. 2B, after forming the gate 350, a passivation layer 210 is formed over the substrate 310 to cover the gate 350 and the gate insulating layer 340. An ion implanting process 110 is performed to form a source/drain 432 in the polysilicon island 330 beside the gate 350, wherein a region between the source and the drain is a channel 434. Next, the passivation layer 210 is removed. In particular, the passivation layer 210 is as a mask during the ion implanting process 110 so that the edges of the source/drain 432 are not aligned to that of the gate 350.

Figure 2C:
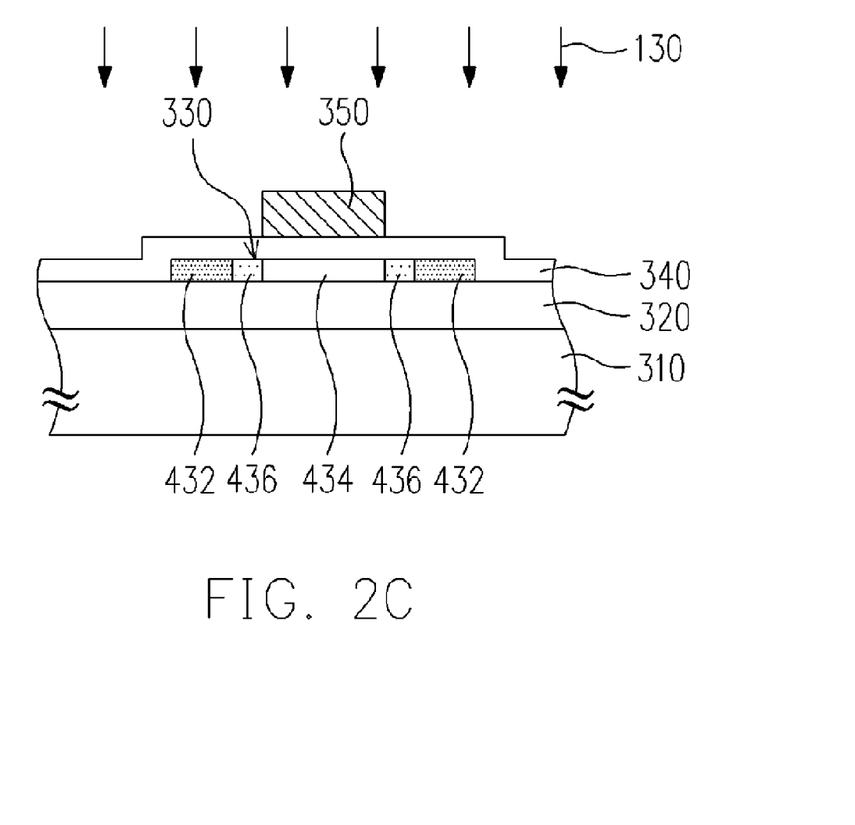

As shown in FIG. 2C, after the passivation layer 210 is removed, a lightly ion implanting process 130 is carried out by using the gate 350 as mask so that a lightly doped drain 436 is formed between the source/drain 432 and the channel 434 to improve hot carrier effect. Comparing with the conventional methods, the present invention does not need an additional photo-mask process to define the lightly doped drain 436. This is because the passivation layer 210 and the gate 350 are used as implanting mask to form the source/drain 432, and then the gate 350 is used as implanting mask to form the lightly doped drain 436 after the passivation layer 210 is removed.

Figure 2D:
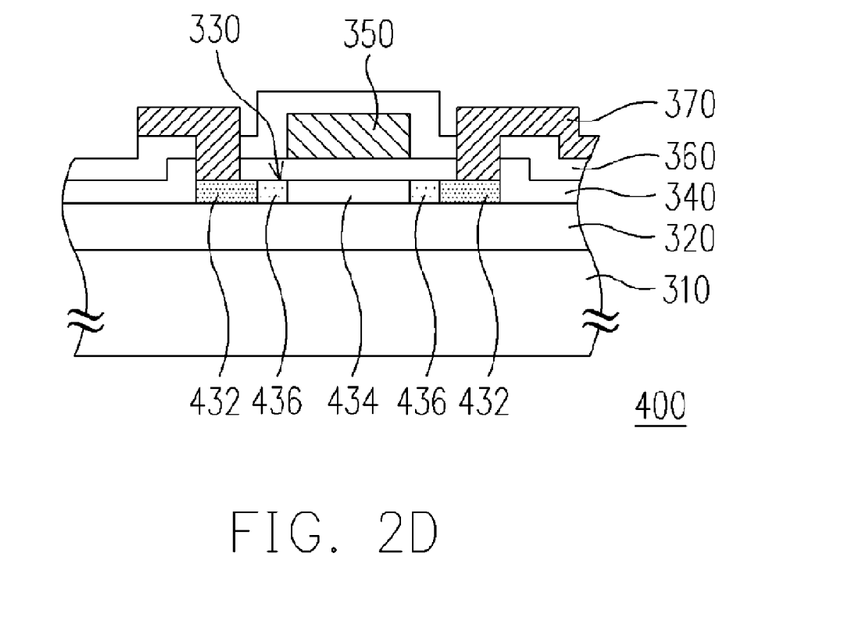

As shown in FIG. 2D, after the passivation layer 210 is removed, the steps comprising forming a patterned dielectric layer 360 exposing a portion of the source/drain 332 and forming a source/drain conductive layer 370 electrically connecting to the source/drain 332 are similar to the first embodiment.

Figure 3A:
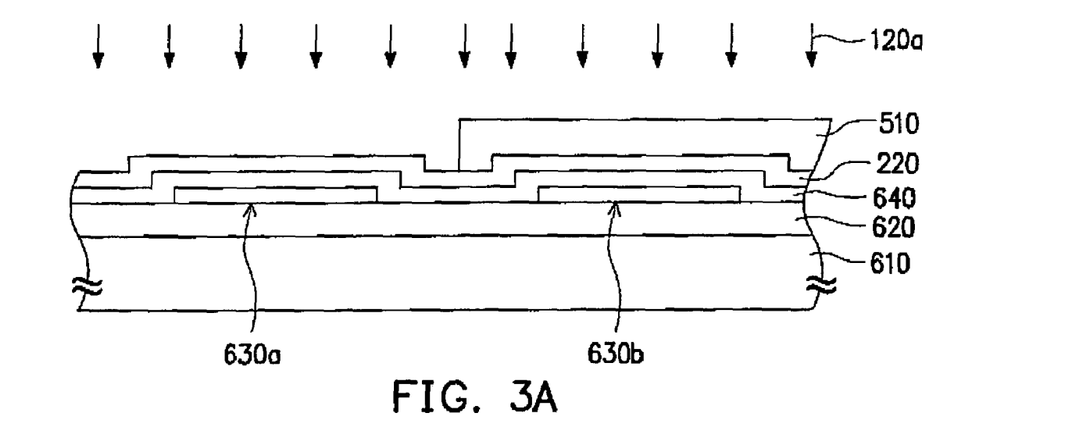
FIG. 3A to FIG. 3F are schematic cross-sectional views showing a method of manufacturing a thin film transistor according a third embodiment of the present invention.

FIG. 3A to FIG. 3F are schematic cross-sectional views showing a method of manufacturing a thin film transistor according a third embodiment of the present invention. As shown in FIG. 3A, a first polysilicon island 630a and a second polysilicon island 630b are formed over a substrate 610, wherein the first and second polysilicon islands 630a, 630b have a thickness in a range of 100~1000 angstrom, and 500 angstrom is preferable. In an embodiment, before forming the first and second polysilicon islands 630a, 630b, a buffer layer 620 is further formed over the substrate 610 to prevent metal ions in the substrate 610 from diffusing into the first and second polysilicon islands 630a, 630b.

A gate insulating layer 640 is formed over the substrate 610 to cover the first and second polysilicon islands 630a, 630b. The gate insulating layer 640 has a thickness in a range of 500~1500 angstrom, and 800 angstrom is preferable. Thereafter, a passivation layer 220 is formed over the gate insulating layer 640. An ion implanting process 120a is performed to dope ions into the first polysilicon island 630a. In detail, before the ion implanting process 120a is performed, a patterned photoresist layer 510 is formed over the substrate 610 exposing the first polysilicon island 630a, and then the ion implanting process 120a is conducted. In an embodiment, p-type dopants, such as boron ions, are implanted into the first polysilicon island 630a. The p-type dopant concentration is between 5E11~5E12 ion/cm$^2$, for example, and 3E12 ions/cm$^2$ is preferable. The ion implanting process 120a has an ion implanting energy in a range of 10~100 keV, and 35 keV is preferable.

Figure 3B:
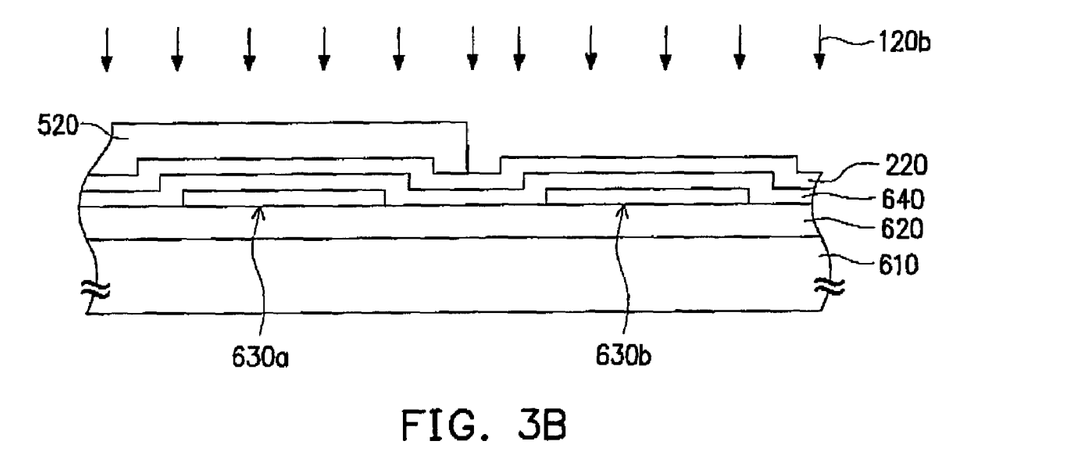

As shown in FIG. 3B, another ion implanting process 120b may further be carried out to dope ions into the second polysilicon island 630b for adjusting the electrical property of the second polysilicon island 630b, if necessary. In detail, after removing the photoresist layer 510, another patterned photoresist layer 520 is formed over the substrate exposing the second polysilicon island 630b. An ion implanting process 120b is conducted to dope ions into the second polysilicon island 630b. Thereafter, the photoresist layer 520 is removed, and the passivation layer 220 is removed.

Figure 3C:
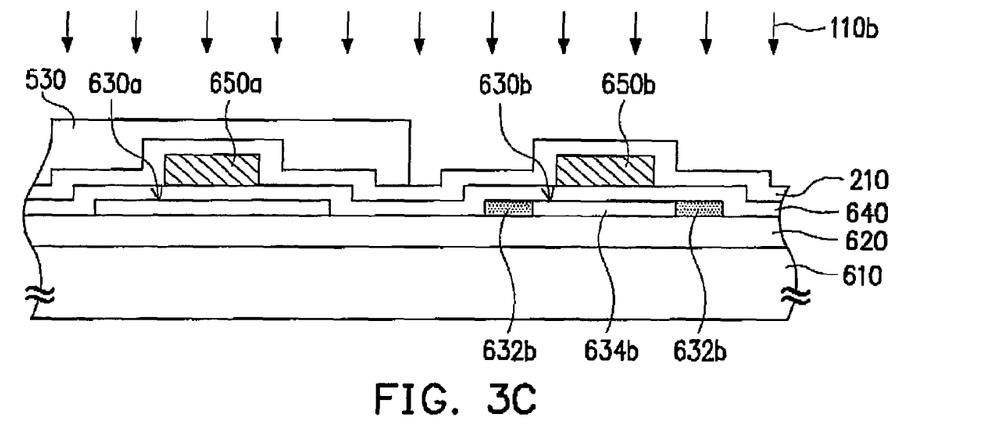

As shown in FIG. 3C, a first gate 650a is formed on the gate insulating layer 640 above the first polysilicon island 630a, and a second gate 650b is formed on the gate insulating layer 640 above the second polysilicon island 630b. The first and second gates 650a, 650b have a thickness in a range of 1000~8000 angstrom, and 4000 angstrom is preferable. A passivation layer 210 is formed over the substrate 610 to cover the first and second gates 650a, 650b.

An ion implanting process 110b is performed to form a second source/drain 632b in the second polysilicon island 630b beside the second gate 650b, and a region between the second source and the second drain is a second channel 634b. In an embodiment, before the ion implanting process 110b is carried out, a patterned photoresist layer 530 is formed over the substrate 610 exposing the second polysilicon island 630b. P-type dopants, such as boron ions, are implanted into the second polysilicon island 630b. The p-type dopant concentration is between 1E14~2E15 ion/cm$^2$, and 1E15 ions/cm$^2$ is preferable. The ion implanting process 110b has an ion implanting energy in a range of 10~100 keV, and 35 keV is preferable. Next, the photoresist layer 530 is removed.

Figure 3D:
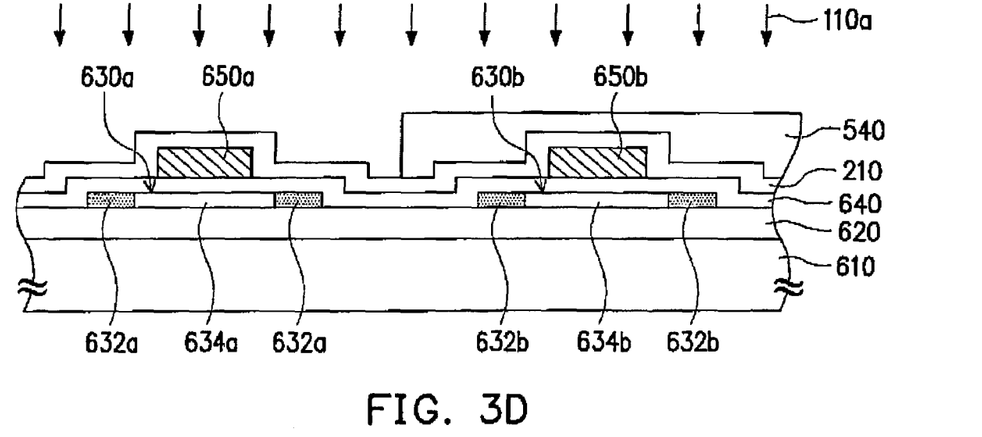

As shown in FIG. 3D, another photoresist layer 540 is formed over the substrate 610 exposing the first polysilicon island 630a. An ion implanting process 110a is carried out to form a first source/drain 632a in the first polysilicon island 630a beside the first gate 650a, and a region between the first source and the first drain is a first channel 634a. In an embodiment, n-type dopants, such as phosphorous ions, are implanted into the first polysilicon island 630a. The n-type dopant concentration is between 1E14~1E15 ion/cm$^2$, and 5E14 ions/cm$^2$ is preferable. The ion implanting process 110a has an ion implanting energy in a range of 10~100 keV, and 70 keV is preferable. Next, at least of the passivation layer 210 above the first polysilicon island 630a is removed.

Figure 3E:
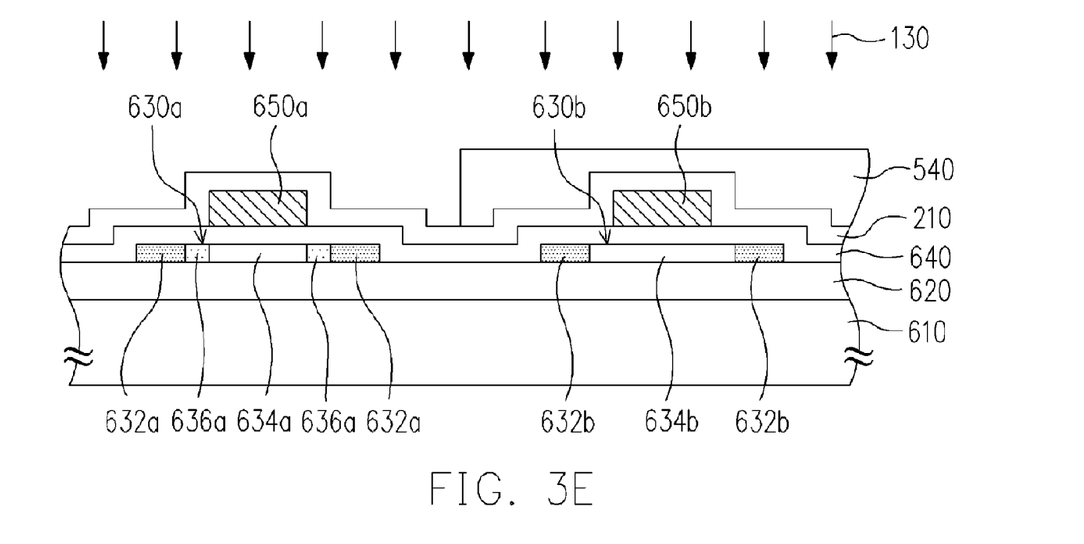

As shown in FIG. 3E, a lightly ion implanting process 130 is performed to form a lightly doped drain 636a between the first source/drain 632a and the first channel 634a. Next, the photoresist layer 540 and the passivation layer 210 are removed. In an embodiment, n-type dopants, such as phosphorous ions, are implanted into the first polysilicon island 630a for forming the lightly doped drain 636a. The n-type dopant concentration is between 1E13~1E14 ion/cm$^2$, and 5E13 ions/cm$^2$ is preferable. The lightly ion implanting process 130 has an ion implanting energy in a range of 10~100 keV, and 50 keV is preferable.

In another embodiment, in FIG. 3D, after forming the first source/drain 632a, the whole passivation layer 210 and the photoresist layer 540 are removed, and then the lightly ion implanting process 130 is carried out to form the lightly doped drain 636a.

Figure 3F:
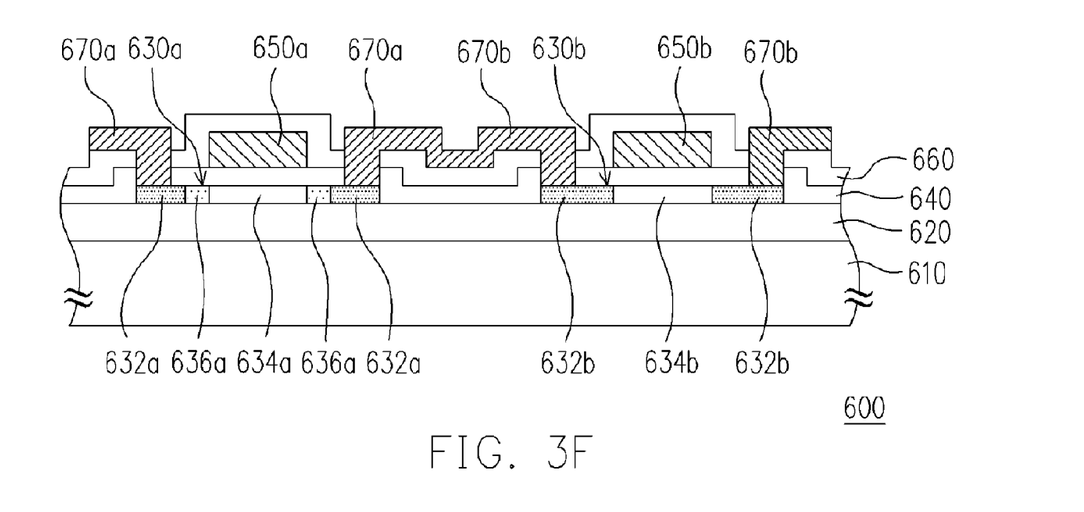

As shown in FIG. 3F, a patterned dielectric layer 660 is formed over the substrate 610, wherein the dielectric layer 660 exposes a portion of the first source/drain 632 and a portion of the second source/drain 632b. The dielectric layer 660 has a thickness in a range of 1000~8000 angstrom, and 4000 angstrom is preferable. Thereafter, a thermal process, such as rapid thermal annealing (RTA), is carried out for the formed structure between 10~90 seconds at 500~650° C. Preferably, the thermal process is performed about 70 seconds at 600° C.

A first source/drain conductive layer 670a and a second source/drain conductive layer 670b are formed over the patterned dielectric layer 660. The first source/drain conductive layer 670a is electrical connected to the first source/drain 632a while the second source/drain conductive layer 670b is electrical connected to the second source/drain 632b. In an embodiment, the first and second source/drain conductive layers 670a, 670b are constituted of Cr or other suitable metal. The first and second source/drain conductive layers 670a, 670b have a thickness in a range of 1000~8000 angstrom, and 4000 angstrom is preferable.

In the present invention, the passivation layer is formed over the substrate before the ion implanting process is performed so that the film underneath the passivation layer is protected. In addition, each of the photoresist layers can be removed easily and not remained because the photoresist layer is formed on the passivation layer. The method of the present invention can also be practiced in other embodiments as following.

Figure 4A:
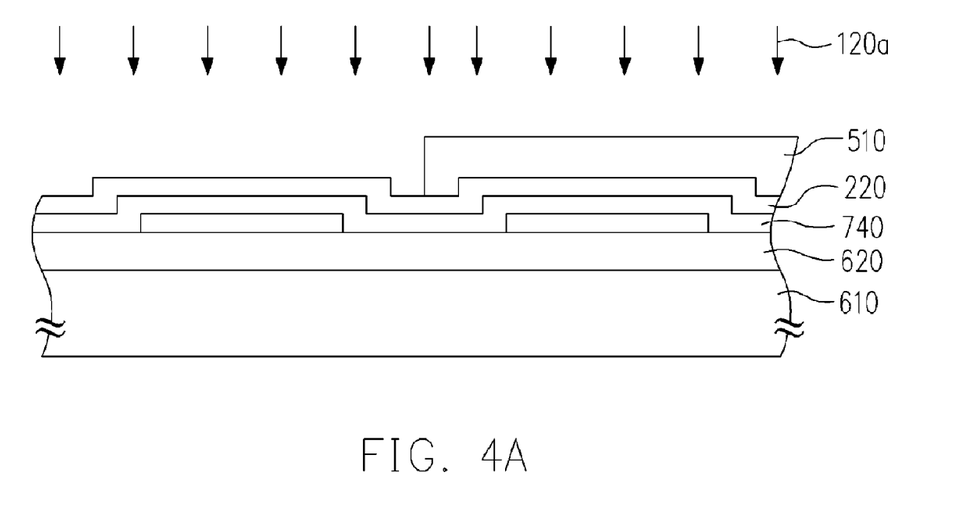
FIG. 4A to FIG. 4F are schematic cross-sectional views showing a method of manufacturing a thin film transistor according a fourth embodiment of the present invention.
Figure 4B:
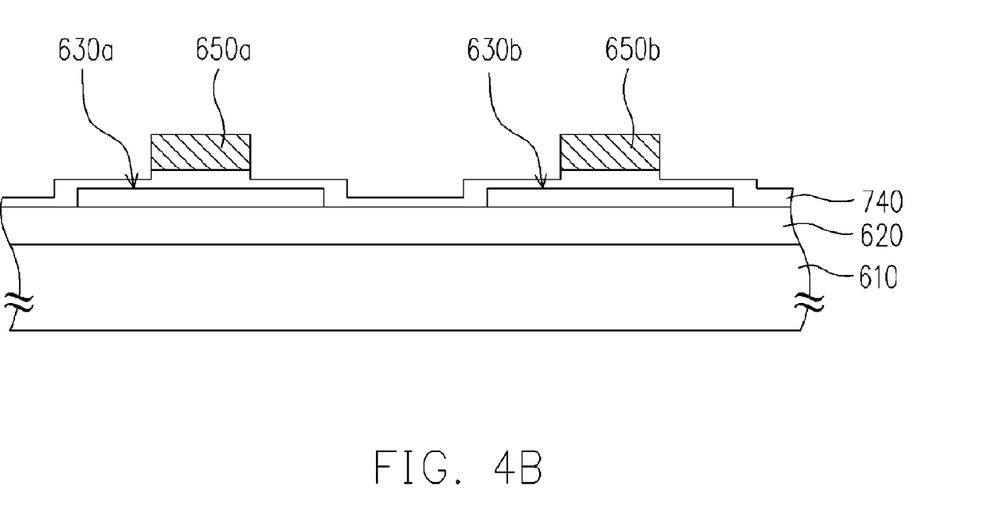
Figure 4C:
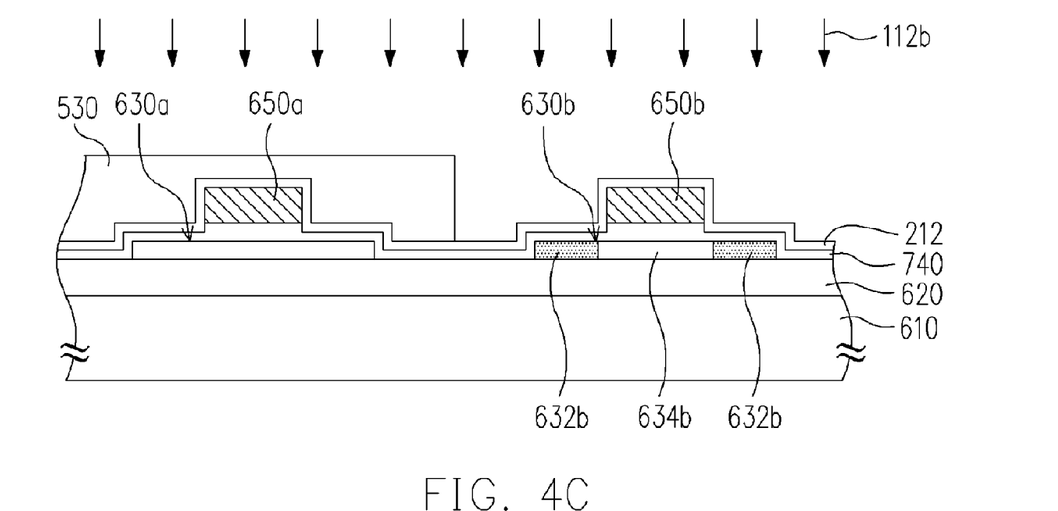
Figure 4D:
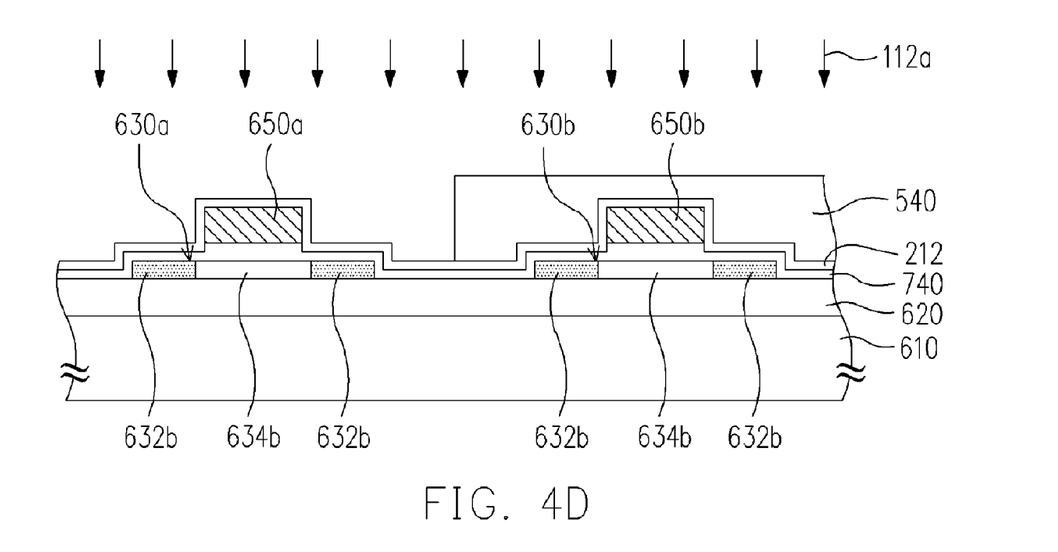
Figure 4E:
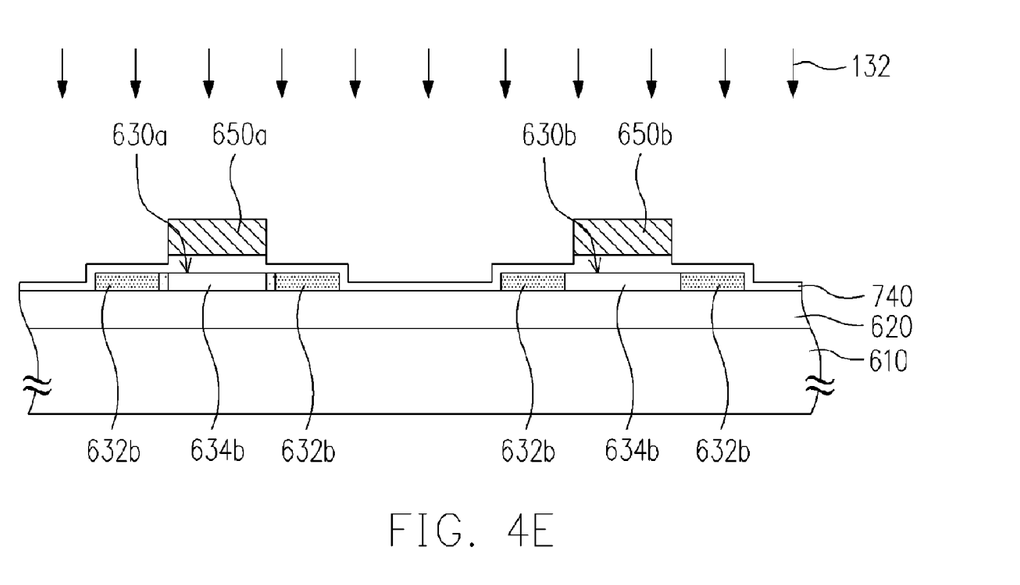
Figure 4F:
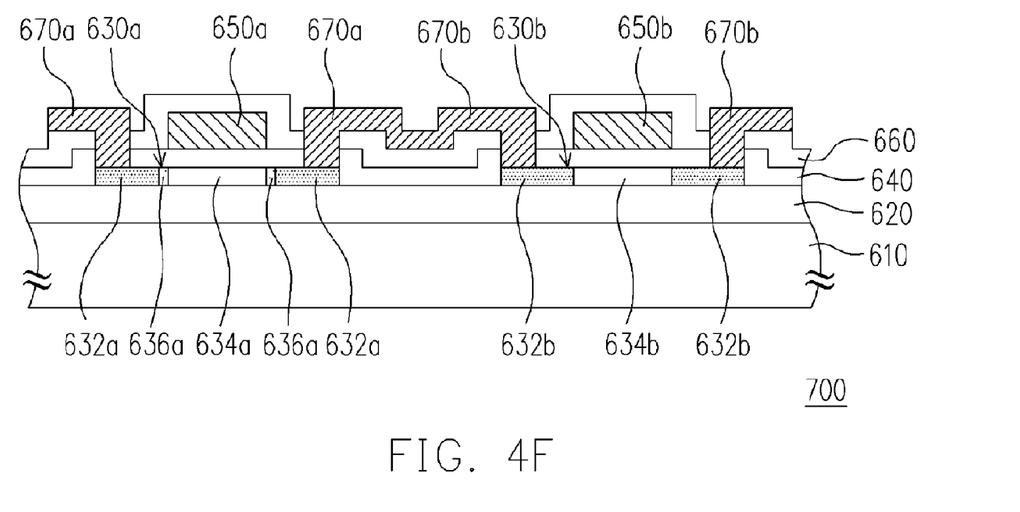

FIG. 4A to FIG. 4F are schematic cross-sectional views showing a method of manufacturing a thin film transistor according a fourth embodiment of the present invention. The steps performed in FIG. 4A are similar to that of FIG. 3A. Also, the step of FIG. 3B may be performed optionally. Thereafter, as shown in FIG. 4B, a first gate 650a is formed on the gate insulating layer 740 above the first polysilicon island 630a, and a second gate 650b is formed on the gate insulating layer 740 above the second polysilicon island 630b. The gate insulating layer 740 is partially etched by using the first and second gates 650a, 650b as etching mask so that the gate insulating layer 740 underneath the first and second gates 650a, 650b has a thickness larger than that of the gate insulating layer 740 at other positions. In an embodiment, the gate insulating layer 740 is etched about 800 angstrom, and the remained gate insulating layer 740 not under the first and second gates 650a, 650b is about 300 angstrom.

Next, the steps performed in FIG. 4C to FIG. 4F are similar to that of FIG. 3C to FIG. 3F comprising forming the second source/drain 632b; forming the first source/drain 632a; forming the lightly doped drain 636a between the first source/drain 632a and the channel 634a; forming the patterned dielectric layer 660; and forming the first and second source/drain conductive layer 670a, 670b. The difference between the third embodiment and the fourth embodiment is that the passivation layer has a thickness in a range of 200~500 angstrom preferably, and the remained gate insulating layer 740 not under the first and second gate 650a, 650b is about 300 angstrom. The ion implanting process 112b is carried out with an ion implanting energy of 40 keV, for example. The ion implanting process 112a is carried out with an ion implanting energy of 75 keV, for example. The lightly ion implanting process 132 is carried out with an ion implanting energy of 30 keV, for example.

Figure 5A:
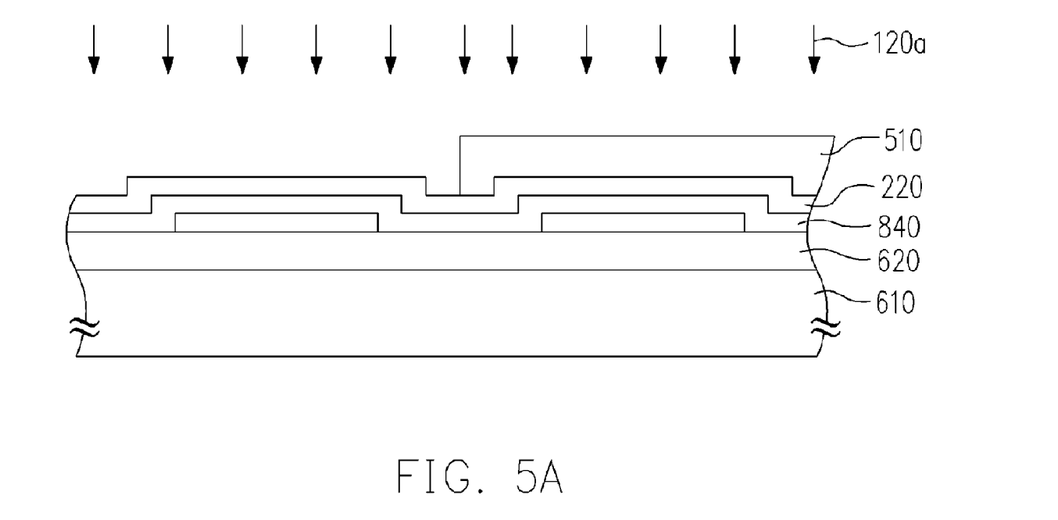
FIG. 5A to FIG. 5F are schematic cross-sectional views showing a method of manufacturing a thin film transistor according a fifth embodiment of the present invention.
Figure 5B:
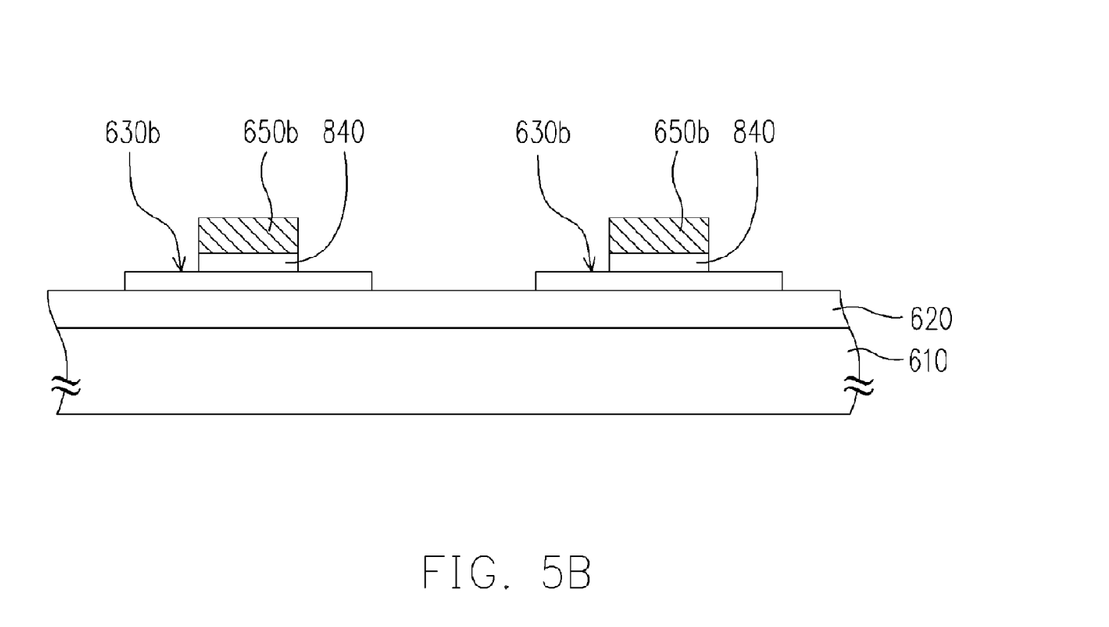
Figure 5C:
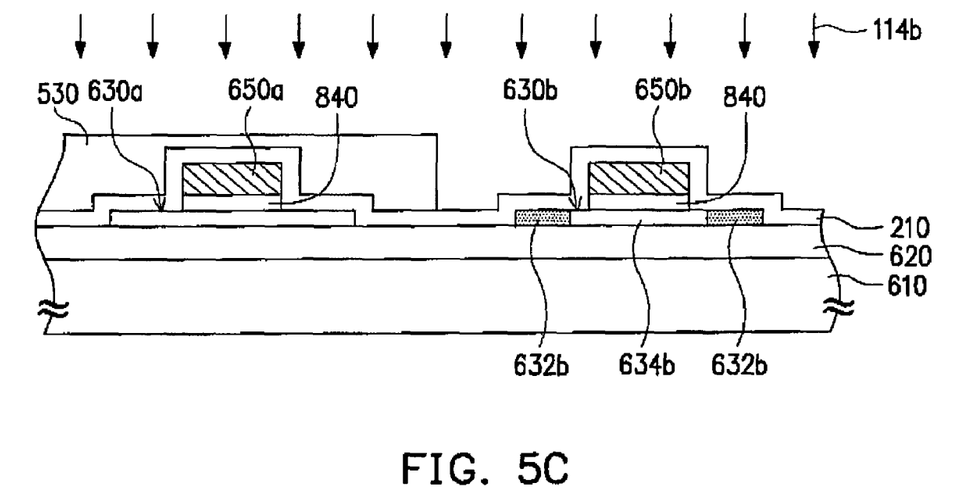
Figure 5D:
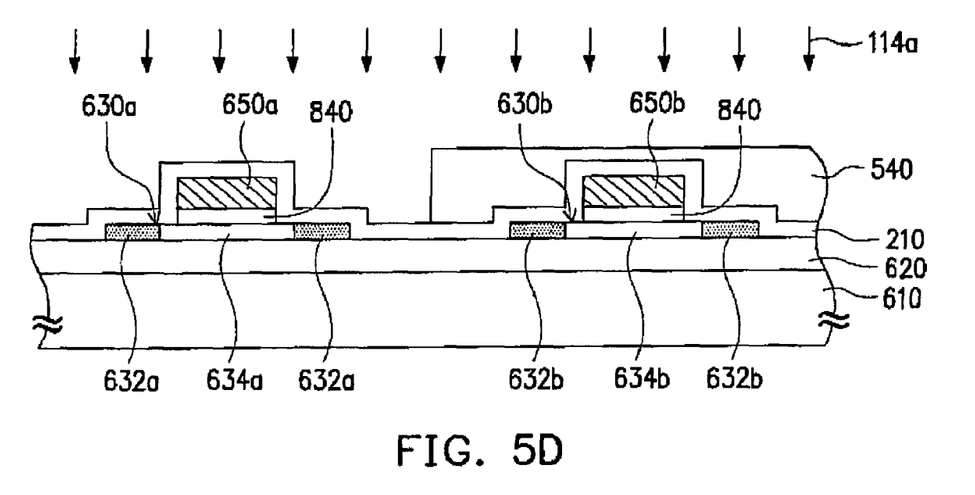
Figure 5E:
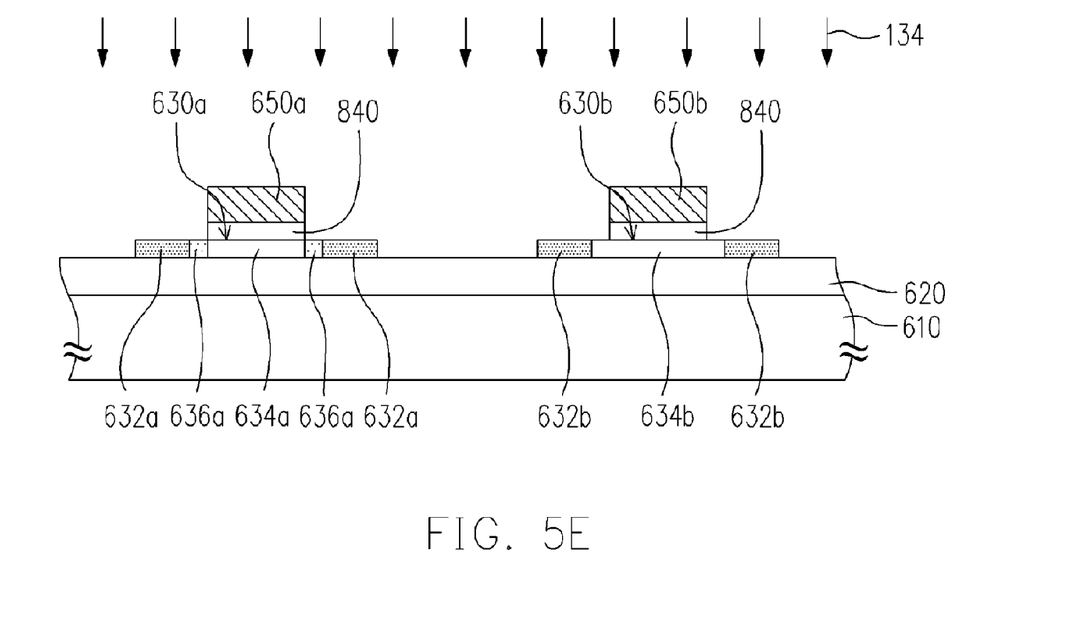
Figure 5F:
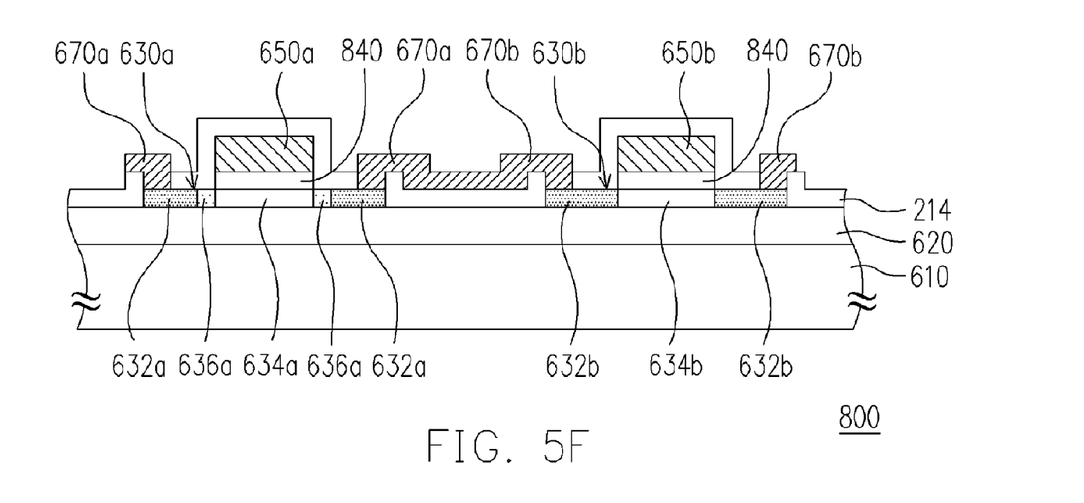

FIG. 5A to FIG. 5F are schematic cross-sectional views showing a method of manufacturing a thin film transistor according a fifth embodiment of the present invention. The steps performed in FIG. 5A are similar to that of FIG. 3A. Also, the step of FIG. 3B may be performed optionally. As shown in FIG. 5B, after forming the first and second gates 650a, 650b, the gate insulating layer 840 is etched by using the first and second gates 650a, 650b as etching mask so as to remove the gate insulating layer 840 not covered by the first and second gates 650a, 650b.

Next, the steps performed in FIG. 5C to FIG. 5F are similar to that of FIG. 3C to FIG. 3F comprising forming the second source/drain 632b; forming the first source/drain 632a; forming the lightly doped drain 636a between the first source/drain 632a and the channel 634a; forming the patterned dielectric layer 660; and forming the first and second source/drain conductive layers 670a, 670b.

The difference between the fourth embodiment and the fifth embodiment is that the passivation layer 212 has a thickness in a range of 500~800 angstrom preferably. The ion implanting process 112b is carried out with an ion implanting energy of 45 keV, for example. The ion implanting process 112a is carried out with an ion implanting energy of 80 keV, for example. Since the first polysilicon island 630a is exposed by the gate insulating layer 840, the lightly ion implanting process 132 is carried out with an ion implanting energy of 10 keV, for example.

Accordingly, in the present invention, the passivation layer is formed over the substrate before the ion implanting process is performed so that the film underneath the passivation layer is protected.

In addition, each of the photoresist layers used as implanting mask can be removed easily and not remained because the photoresist layer is formed on the passivation layer.

The passivation layer can also be used as implanting mask for the lightly doped drain so that the photo-mask process for the lightly ion implanting process is not needed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a thin film transistor, comprising:
    forming a polysilicon island over a substrate;
    forming a gate insulating layer over the substrate to cover the polysilicon island;
    forming a second passivation layer over the gate insulating layer;
    performing a second ion implanting process to dope ions into the polysilicon island; and
    removing the second passivation layer;
    forming a gate on the gate insulating layer above the polysilicon island;
    forming a first passivation layer over the substrate to cover the gate and the gate insulating layer;
    performing an ion implanting process to form a source/drain in the polysilicon island beside the gate, wherein a region between the source and the drain is a channel;
    removing the first passivation layer;
    forming a patterned dielectric layer over the substrate, wherein the patterned dielectric layer exposes a portion of the source and the drain; and
    forming a source/drain conductive layer over the patterned dielectric layer, wherein the source/drain conductive layer is electrically connected to the source/drain.

2. The method according to claim 1, wherein the first passivation layer comprises a silicon nitride layer.

3. The method according to claim 1, wherein the first passivation layer has a thickness in a range of 50~1000 angstrom.

4. The method according to claim 1, wherein after the step of removing the first passivation layer and before the step of forming the patterned dielectric layer further comprising:
    performing a lightly ion implanting process to form a lightly doped drain (LDD) between the channel and the source/drain by using the gate as mask.

5. The method according to claim 1, wherein the second passivation layer comprises a silicon nitride layer.

6. The method according to claim 1, wherein the second passivation layer has a thickness in a range 50~1000 angstrom.

7. The method according to claim 1, wherein after the step of forming the gate on the gate insulating layer and before the step of forming the first passivation layer over the substrate further comprising:
    partially etching the gate insulating layer by using the gate as mask so that the gate insulating layer under the gate has a thickness larger than that of the gate insulating layer at other positions.

8. The method according to claim 1, wherein after the step of forming the gate on the gate insulating layer and before the step of forming the first passivation layer over the substrate further comprising:
    etching the gate insulating layer by using the gate as mask so as to remove the gate insulating layer not covered by the gate.

9. The method according to claim 1, wherein before the step of forming the polysilicon island further comprising forming a buffer layer over the substrate.

10. A method of manufacturing a thin film transistor, comprising:
    forming a first polysilicon island and a second polysilicon island over a substrate;
    forming a gate insulating layer over the substrate to cover the first and second polysilicon islands;
    forming a first passivation layer over the gate insulating layer;
    performing a first ion implanting process to dope ions into the first polysilicon island;
    removing the first passivation layer;
    forming a first gate on the gate insulating layer above the first polysilicon island and forming a second gate on the gate insulating layer above the second polysilicon island;
    forming a second passivation layer over the substrate to cover the first and second gates;
    performing a second ion implanting process to form a second source/drain in the second polysilicon island beside the second gate, wherein a region between the second source and the second drain is a second channel;
    performing a third ion implanting process to form a first source/drain in the first polysilicon island beside the first gate, wherein a region between the first source and the first drain is a first channel;
    removing the second passivation layer above the first polysilicon island; and
    performing a lightly ion implanting process to farm a lightly doped drain (LDD) between the first channel and the first source/drain.

11. The method according to claim 10, wherein the first passivation layer comprises a silicon nitride layer.

12. The method according to claim 10, wherein the first passivation layer has a thickness in a range of 50~1000 angstrom.

13. The method according to claim 10, wherein the second passivation layer comprises a silicon nitride layer.

14. The method according to claim 10, wherein the second passivation layer has a thickness in a range of 50~1000 angstrom.

15. The method according to claim 10, wherein after removing the second passivation layer further comprising:
    forming a patterned dielectric layer over the substrate, wherein the patterned dielectric layer exposes a portion of the first source/drain and a portion of the second source/drain; and
    forming a first source/drain conductive layer arid a second source/drain conductive layer over the patterned dielectric layer, wherein the first source/drain conductive layer is electrically connected to the first source/drain while the second source/drain conductive layer is electrically connected to the second source/drain.

16. The method according to claim 10, wherein after the step of forming the first and second gate further comprising:
partially etching the gate insulating layer by using the first and second gates as mask so that the gate insulating layer under the first and second gates have a thickness larger than that of the gate insulating layer at other positions.

17. The method according to claim 10, wherein after the step of forming the first and second gate further comprising:
etching the gate insulating layer by using the first and second gates as mask so as to remove the gate insulating layer not covered by the first and second gates.

18. The method according to claim 10, wherein all of the second passivation layer is removed at the step of removing the second passivation layer above the first polysilicon island.

19. The method according to claim 10, wherein after the step of implanting ions in the first polysilicon island and before the step of removing the first passivation layer further comprising performing a fourth ion implanting process to dope ions into the second polysilicon island.

* * * * *